(12) United States Patent
Tsai et al.

(10) Patent No.: US 12,733,483 B2
(45) Date of Patent: Sep. 8, 2026

(54) TRANSISTOR WITH SOURCE AND DRAIN VIA STRUCTURES

(71) Applicant: Taiwan Semiconductor Manufacturing Company, Ltd., Hsinchu (TW)

(72) Inventors: Kuo-Chiang Tsai, Hsinchu City (TW); Pei-Hsuan Lin, Hsinchu City (TW); Jeng-Ya Yeh, New Taipei City (TW); Mu-Chi Chiang, Hsinchu (TW)

(73) Assignee: Taiwan Semiconductor Manufacturing Company, Ltd., Hsinchu (CN)

( * ) Notice: Subject to any disclaimer, the term of this patent is extended or adjusted under 35 U.S.C. 154(b) by 971 days.

(21) Appl. No.: 17/873,180

(22) Filed: Jul. 26, 2022

(65) Prior Publication Data

US 2024/0038658 A1 Feb. 1, 2024

(51) Int. Cl.

| | |
|---|---|
| ***H10W 20/41*** | (2026.01) |
| ***H10B 10/00*** | (2023.01) |
| ***H10D 30/01*** | (2025.01) |
| ***H10D 30/62*** | (2025.01) |
| ***H10D 62/13*** | (2025.01) |
| ***H10D 64/01*** | (2025.01) |

(Continued)

(52) U.S. Cl.

CPC .......... *H10W 20/435* (2026.01); *H10B 10/12* (2023.02); *H10D 30/6219* (2025.01); *H10D 62/151* (2025.01); *H10D 64/01* (2025.01); *H10D 64/258* (2025.01); *H10D 84/0133* (2025.01); *H10D 84/0149* (2025.01); *H10D 84/0158* (2025.01); *H10D 84/038* (2025.01); *H10D 84/834* (2025.01); *H10W 20/089* (2026.01); *H10W 20/42* (2026.01); *H10W 20/43* (2026.01); *H10D 30/024* (2025.01); *H10D 30/6211* (2025.01); *H10W 20/033* (2026.01)

(58) Field of Classification Search

CPC ..... H10D 64/251–259; H10D 84/0149; H10D 84/0158; H10D 84/834; H10D 30/024; H10D 30/6211; H01L 23/5283; H01L 23/5226; H01L 23/528; H01L 21/76816; H01L 21/76843; H10W 20/435; H10W 20/089; H10W 20/42; H10W 20/43; H10W 20/033

See application file for complete search history.

(56) References Cited

U.S. PATENT DOCUMENTS

| | | | | |
|---|---|---|---|---|
| 2011/0222332 A1* | 9/2011 | Liaw | H10B 10/12 365/156 |
| 2017/0004998 A1* | 1/2017 | Pethe | H10W 20/069 |

(Continued)

*Primary Examiner* — Aaron J Gray

(74) *Attorney, Agent, or Firm* — JCIPRNET

(57) ABSTRACT

A semiconductor device includes a source region and a drain region, a first source contact, a first drain contact, a first drain via and a first source via. The source region and the drain region are located over a substrate. The first source contact is disposed on the source region, and the first drain contact is disposed on the drain region. The first drain via is connected to the first drain contact, wherein the first drain via includes a barrier-less body portion. The first source via is connected to the first source contact, wherein the first source via includes a body portion and a barrier layer surrounding the body portion, and a size of the first source via is greater than a size of the first drain via.

20 Claims, 13 Drawing Sheets

(51) Int. Cl.

| | |
|---|---|
| ***H10D 64/23*** | (2025.01) |
| ***H10D 84/01*** | (2026.01) |
| ***H10D 84/03*** | (2025.01) |
| ***H10D 84/83*** | (2025.01) |
| ***H10W 20/00*** | (2026.01) |
| ***H10W 20/42*** | (2026.01) |
| ***H10W 20/43*** | (2026.01) |

(56) References Cited

U.S. PATENT DOCUMENTS

2018/0366463 A1* 12/2018 Cho ........................ H10D 84/83
2021/0035986 A1* 2/2021 Yu .......................... H10D 89/10
2022/0052168 A1* 2/2022 Chang .................. H10D 64/258
2022/0223517 A1* 7/2022 Wang ..................... H10D 30/62

* cited by examiner 128
126
124
102
B'
OP2
122
120
122
OP3
122
120
122
OP2
124
B

TRANSISTOR WITH SOURCE AND DRAIN VIA STRUCTURES

BACKGROUND

The semiconductor integrated circuit (IC) industry has experienced a fast-paced growth. Technological advances in IC materials and design have produced generations of ICs where each generation has smaller and more complex circuits than the previous generation. In the course of TC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

DETAILED DESCRIPTION

Figure 1:
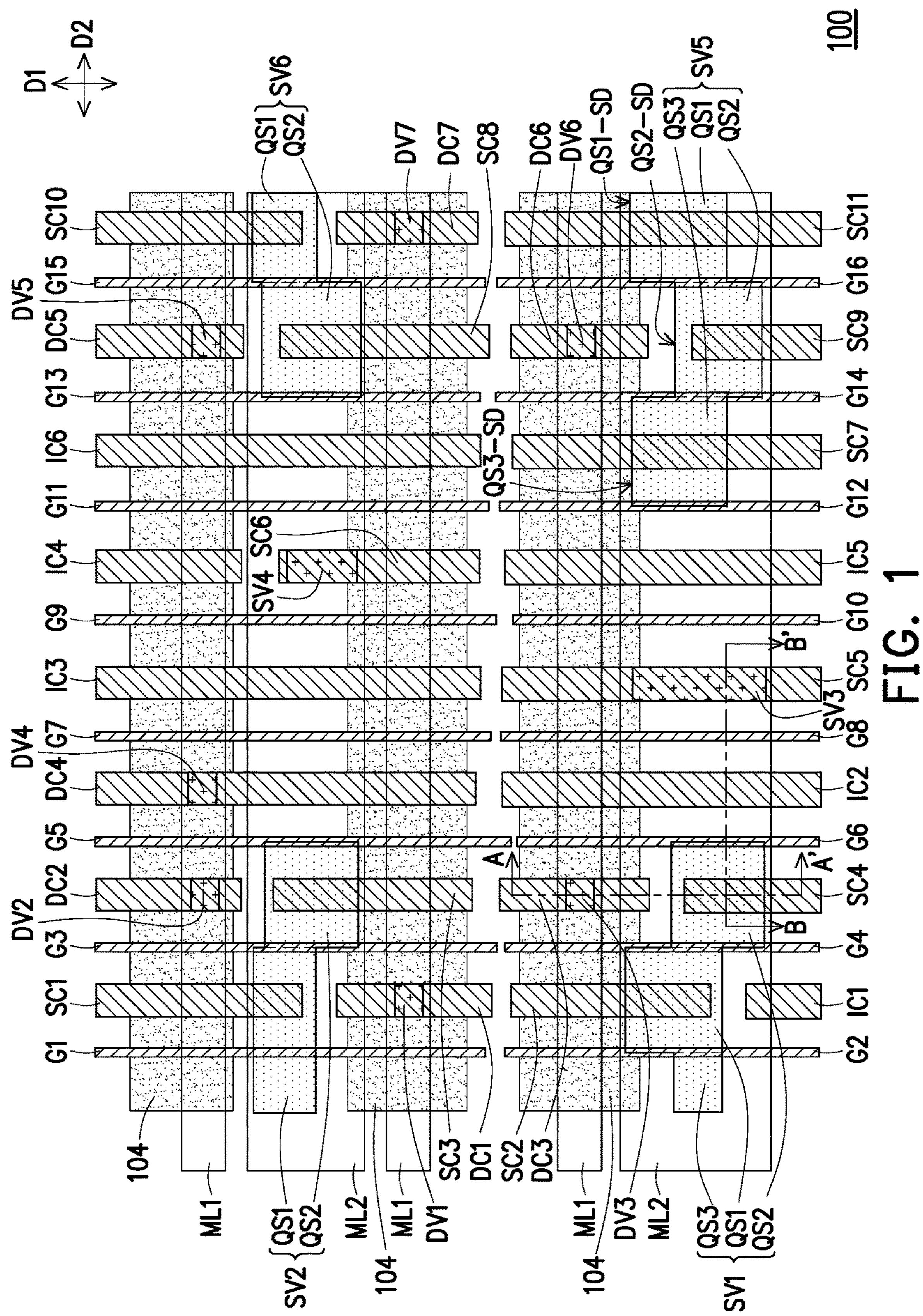
FIG. 1 is a top view of a semiconductor device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Conventional semiconductor devices usually have source vias and drain vias with approximately the same sizes. The dimensions of the source vias and the drain vias are usually limited within the width of the source/drain contacts (the width of the power rails). In other words, conventional source/drain vias do not extend beyond the width boundaries of the source/drain contacts. As semiconductor fabrication progresses to ever smaller technology nodes, the overall contribution made by contact resistances may begin to degrade device performance, such as device speed. In general, contact resistance reduces when the contact surface area increases. It is noted that the contact surface area on the source side is often determined by the via structure dimensions. On the other hand, contact surface area on the drain side is often limited to the metal line width regardless of via structure dimensions. In some embodiments of the present disclosure, to further reduce contact resistance and improve device performance, the source side vias (source side power rail) are made with a larger contact surface area to the source contact, as compared to the contact surface area of the drain side vias (drain side power rail) to the drain contact.

FIG. 1 is a top view of a semiconductor device in accordance with some embodiments of the present disclosure. Referring to FIG. 1, the semiconductor device 100 may be an intermediate device fabricated during processing of an integrated circuit, or a portion thereof. In some embodiments, the semiconductor device 100 may comprise static random-access memory (SRAM) and/or other logic circuits, passive components such as resistors, capacitors, and inductors, and active components such as p-type field effect transistors (PFETs), n-type FETs (NFETs), FinFETs, metal-oxide semiconductor field effect transistors (MOSFET), complementary metal-oxide semiconductor (CMOS) transistors, bipolar transistors, high voltage transistors, high frequency transistors, and/or other memory cells. In some embodiments, the semiconductor device 100 may apply to three-dimensional FinFET devices, or to planar FET devices, but the disclosure is not limited thereto. Furthermore, the semiconductor device 100 is not limited to any particular number of devices or device regions, or to any particular device configurations.

As illustrated in FIG. 1, the semiconductor device 100 includes a plurality of fin structures 104 disposed on a substrate (not shown). Furthermore, a plurality of gate structures G1~G16 is disposed on the substrate to intersect with the fin structures 104. For example, the gate structures G1~G16 are extending along a first direction D1, while the fin structures 104 are extending along a second direction D2 perpendicular to the first direction D1. In some embodiments, drain regions 110A and source regions 110B are disposed over the fin structures 104. The drain regions 110A and source regions 110B are omitted in FIG. 1 for ease of illustration. However, these regions are further illustrated and described in the later figures. In some embodiments, the drain regions 110A and the source regions 110B may include epitaxial layers (or epi-layers) that are epitaxially grown in the active regions (over the fin structures). In certain embodiments, the drain regions 110A and the source regions 110B may be disposed on two opposing sides of the gate structures G1~G16.

In some embodiments, the semiconductor device 100 further includes a plurality of source contacts SC1~SC11, a plurality of drain contacts DC1~DC7, and a plurality of interconnect structures IC1~IC6 disposed over the substrate. The source contacts SC1~SC11, the drain contacts DC1~DC7 and the interconnect structures IC1~IC6 are extending along the first direction D1 and disposed in parallel with the gate structures G1~G16. In some embodiments, the source contacts SC1~SC11 are disposed on the source regions 110B (not shown), while the drain contacts DC1~DC7 are disposed over the drain regions 110A (not shown). In some embodiments, the interconnect structures IC1~IC6 may be connected to drain contacts or source contacts located in other regions of the semiconductor device 100.

As illustrated in FIG. 1, in some embodiments, the source contact SC1 and the drain contact DC1 are disposed in between the gate structure G1 and the gate structure G3. The source contact SC2 and the interconnect structure IC1 are disposed in between the gate structure G2 and the gate structure G4. The drain contact DC2 and the source contact SC3 are disposed in between the gate structure G3 and the gate structure G5. The drain contact DC3 and the source contact SC4 are disposed in between the gate structure G4 and the gate structure G6. The drain contact DC4 is disposed in between the gate structure G5 and the gate structure G7. The interconnect structure IC2 is disposed in between the gate structure G6 and the gate structure G8. The interconnect structure IC3 is disposed in between the gate structure G7 and the gate structure G9. The source contact SC5 is disposed in between the gate structure G8 and the gate structure G10. The interconnect structure IC4 and the source contact SC6 are disposed in between the gate structure G9 and the gate structure G11. The interconnect structure IC5 is disposed in between the gate structure G10 and the gate structure G12. The interconnect structure IC6 is disposed in between the gate structure G11 and the gate structure G13. The source contact SC7 is disposed in between the gate structure G12 and the gate structure G14. The drain contact DC5 and the source contact SC8 are disposed in between the gate structure G13 and the gate structure G15. The drain contact DC6 and the source contact SC9 are disposed in between the gate structure G14 and the gate structure G16. The source contact SC10 and the drain contact DC7 are disposed on another side of the gate structure G15, opposite to the drain contact DC5 and the source contact SC8. Furthermore, the source contact SC11 is disposed on another side of the gate structure G16, opposite to the drain contact DC6 and the source contact SC9.

Moreover, the semiconductor device 100 further comprises a plurality of source vias SV1~SV6 disposed on the source contacts SC1~SC11 and a plurality of drain vias DV1~DV7 disposed on the drain contacts DC1~DC7. In the exemplary embodiment, the source via SV1 is a shared source via that extends from the source contact SC2 over the gate structure G4 and towards the source contact SC4. For example, from the top view of the semiconductor device 100 shown in FIG. 1, the source via SV1 has a first quadrilateral-shaped portion QS1, a second quadrilateral-shaped portion QS2 and a third quadrilateral-shaped portion QS3. The quadrilateral-shaped portions may be a rectangular or square shaped portion. However, the disclosure is not limited thereto, and the shapes of the source vias may be adjusted based on design requirements. In some embodiments, the first quadrilateral-shaped portion QS1 is overlapped with the source contact SC2 and the gate structures G2, G4, and is connected to the source contact SC2. The second quadrilateral-shaped portion QS2 is overlapped with the source contact SC4 and the gate structures G4, G6, and is connected to the source contact SC4. Furthermore, the third quadrilateral-shaped portion QS3 is overlapped with the second gate G2, and whereby the first quadrilateral-shaped portion QS1 is connecting the third quadrilateral-shaped portion QS3 to the second quadrilateral-shaped portion QS2. In some embodiments, a sidewall of the first quadrilateral-shaped portion QS1 is misaligned with a sidewall of the second quadrilateral-shaped portion QS2 and a sidewall of the third quadrilateral-shaped portion QS3. In addition, sidewalls of the source via SV1 extends beyond sidewalls of the source contacts SC2, SC4.

Similar to the source via SV1, in some embodiments, the source via SV2, the source via SV5 and the source via SV5 are shared source vias that extends between at least two source contacts, and may include the same quadrilateral-shaped portions described above. For example, the source via SV2 is connected to and extends from the source contact SC1 to the source contact SC3, and is overlapped with the gate structures G1 and G3. The source via SV2 includes a first quadrilateral-shaped portion QS1 and a second quadrilateral-shaped portion QS2. The first quadrilateral-shaped portion QS1 is overlapped with the gate structures G1, G2 and the source contact SC1, and is connected to the source contact SC1. The second quadrilateral-shaped portion QS2 is joined with the first quadrilateral-shaped portion QS1 with misaligned sidewalls, whereby the second quadrilateral-shaped portion QS2 is overlapped with the gate structures G3, G5 and the source contact SC3, and is connected to the source contact SC3. In addition, sidewalls of the source via SV2 extends beyond sidewalls of the source contacts SC1, SC3.

In some embodiments, the source via SV5 is connected to and extends from the source contact SC7, over the source contact SC9 and towards the source contact SC11. In other words, the source via SV5 is connected to three source contacts. Furthermore, the source via SV5 is overlapped with the gate structures G12, G14 and G16. In some embodiments, the source via SV5 includes a first quadrilateral-shaped portion QS1, a second quadrilateral-shaped portion QS2 and a third quadrilateral-shaped portion QS3. The first quadrilateral-shaped portion QS1 is overlapped with the source contact SC11 and the gate structure G16, and is connected to the source contact SC11. The second quadrilateral-shaped portion QS2 is overlapped with the source contact SC9 and the gate structures G14, G16, and is connected to the source contact SC9. The third quadrilateral-shaped portion QS3 is overlapped with the source contact SC7 and the gate structures G12, G14, and is connected to the source contact SC7. In some embodiments, the second quadrilateral-shaped portion QS2 is joining the first quadrilateral-shaped portion QS1 to the third quadrilateral-shaped portion QS3. Furthermore, the sidewalls QS1-SD of the first quadrilateral-shaped portion QS1 are misaligned with sidewalls QS2-SD of the second quadrilateral-shaped portion QS2 and sidewalls QS3-SD of the third quadrilateral-shaped portion QS3. In addition, sidewalls of the source via SV5 extends beyond sidewalls of the source contacts SC7, SC7 and SC11.

In some embodiments, the source via SV6 is connected to and extends from the source contact SC8 towards the source contact SC10, and is overlapped with the gate structures G13, G15. The source via SV6 includes a first quadrilateral-shaped portion QS1 and a second quadrilateral-shaped portion QS2. The first quadrilateral-shaped portion QS1 is overlapped with the source contact SC10 and the gate structure G15, and is connected to the source contact SC10. The second quadrilateral-shaped portion QS2 is joined with the first quadrilateral-shaped portion QS1 with misaligned sidewalls, whereby the second quadrilateral-shaped portion QS2 is overlapped with the gate structures G13, G15 and the source contact SC8, and is connected to the source contact SC8. In addition, sidewalls of the source via SV6 extends beyond sidewalls of the source contacts SC8, SC10.

As further illustrated in FIG. 1, the source via SV3 is disposed on and connected to the source contact SC5, while the source via SV4 is disposed on and connected to the source contact SC6. In the exemplary embodiment, since the source contact SC5 and the source contact SC6 are not located near any other source contacts, the source via SV3 and the source via SV4 are respectively connected to one source contact, and are not shared source vias. In some embodiments, the source vias SV1~SV2 and SV5~SV6 are shared source vias that extends beyond sidewalls of the source contacts SC1~SC4 and SC7~SC11 along the second direction D2, and are vias having a body portion and a barrier layer. In certain embodiments, the source vias SV3~SV4 do not extend beyond the width boundaries of the source contacts SC5, SC6 along the second direction D2, and are vias that includes a barrier-less body portion. In the exemplary embodiment, if any two source contacts are located nearby, then a single source via may be used for connecting the two source contacts. In the alternative, one source via is connected to one source contact if no other source contacts are located nearby.

In some embodiments, each of the drain vias DV1~DV7 are disposed on and connected to each of the drain contacts DC1~DC7. In the exemplary embodiment, a width (or length) of the source vias SV1~SV6 extending in the first direction D1 is greater than a width (or length) of the drain vias DV1~DV7 extending in the first direction D1. Furthermore, a width (or length) of the source vias SV1~SV6 extending in the second direction D2 is greater than a width (or length) of the drain vias DV1~DV7 extending in the second direction D2. In some embodiments, a ratio of a top surface area of each of the drain vias DV1~DV7 to a top surface area of each of the source vias SV1~SV6 is in a range of 1:1.1 to 1:50. In certain embodiments, a ratio of the top surface area of each of the drain vias DV1~DV7 to the top surface area of each of the source vias SV1~SV6 is in a range of 1:2 to 1:25. In some other embodiments, a ratio of the top surface area of each of the drain vias DV1~DV7 to the top surface area of each of the source vias SV1~SV6 is in a range of 1:10 to 1:30. In yet another embodiment, a ratio of the top surface area of each of the drain vias DV1~DV7 to the top surface area of each of the source vias SV1~SV6 is in a range of 1:25 to 1:50. In other words, the top surface area of all the source vias SV1~SV6 is greater than the top surface area of all the drain vias DV1~DV7. Furthermore, a source contact surface area (landing surface) of the source vias SV1~SV6 to the respective source contacts SC1~SC11 is greater than a drain contact surface area of the drain vias DV1~DV7 to the respective drain contacts DC1~DC7. In one exemplary embodiment, a source contact surface area of the source via SV1 to the source contact SC2 and the source contact SC4, is greater than a sum of the drain contact surface areas of the drain via DV1 to drain contact DC1 and the drain via DV2 to the drain contact DC2.

As further illustrated in FIG. 1, metal lines ML1 are disposed on and connected to the drain vias DV1~DV7, while metal lines ML2 are disposed on and connected to the source vias SV1~SV6. For example, a metal line ML1 is connected to the drain vias DV2, DV4 and DV5 located in the same row along the second direction DR2, another metal line ML1 is connected to the drain vias DV1 and DV7 located in the same row along the second direction DR2, while a further metal line ML1 is connected to the drain vias DV3, DV6 located in the same row along the second direction DR2. Similarly, a metal line ML2 is connected to the source vias SV2, SV4 and SV6 located in the same row along the second direction DR2, while another metal line ML2 is connected to the source vias SV1, SV3, and SV5 located in the same row along the second direction DR2. In the exemplary embodiment, a width of the metal line ML2 measured along the first direction D1 is greater than a width of the first metal line ML1 measured along the first direction D1.

In the semiconductor device 100, by designing the source vias SV1~SV6 to have a larger contact surface area (landing surface) to the contact structures underneath as compared to the drain vias DV1~DV7, the contact resistance and sheet resistance are further reduced, and the device performance is further improved. The method of fabricating the semiconductor device 100 will be described in more detail by referring to FIG. 2A to FIG. 7B.

FIG. 2A to FIG. 7B are schematic sectional views of various stages in a method of fabricating a semiconductor device in accordance with some embodiments of the present disclosure. FIG. 2A, FIG. 3A, FIG. 4A, FIG. 5A, FIG. 6A and FIG. 7A respectively illustrates a cross section taken along the lines A-A' of FIG. 1 at various stages of fabricating the semiconductor device 100. Furthermore, FIG. 2B, FIG. 3B, FIG. 4B, FIG. 5B, FIG. 6B and FIG. 7B respectively illustrates a cross section taken along the lines B-B' of FIG. 1 at various stages of fabricating the semiconductor device 100.

Figure 2A:
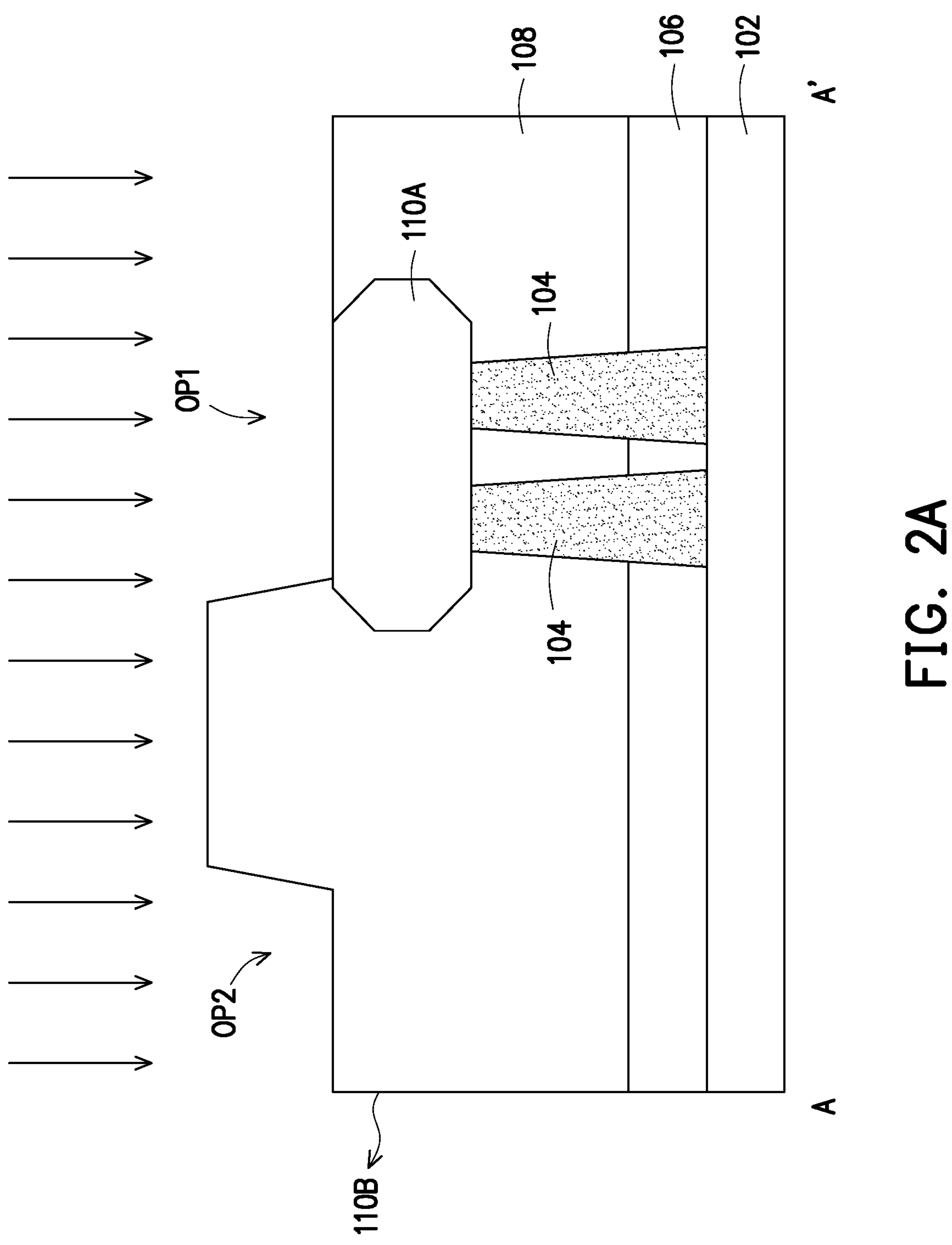
FIG. 2A to FIG. 7B are schematic sectional views of various stages in a method of fabricating a semiconductor device in accordance with some embodiments of the present disclosure.
Figure 2B:
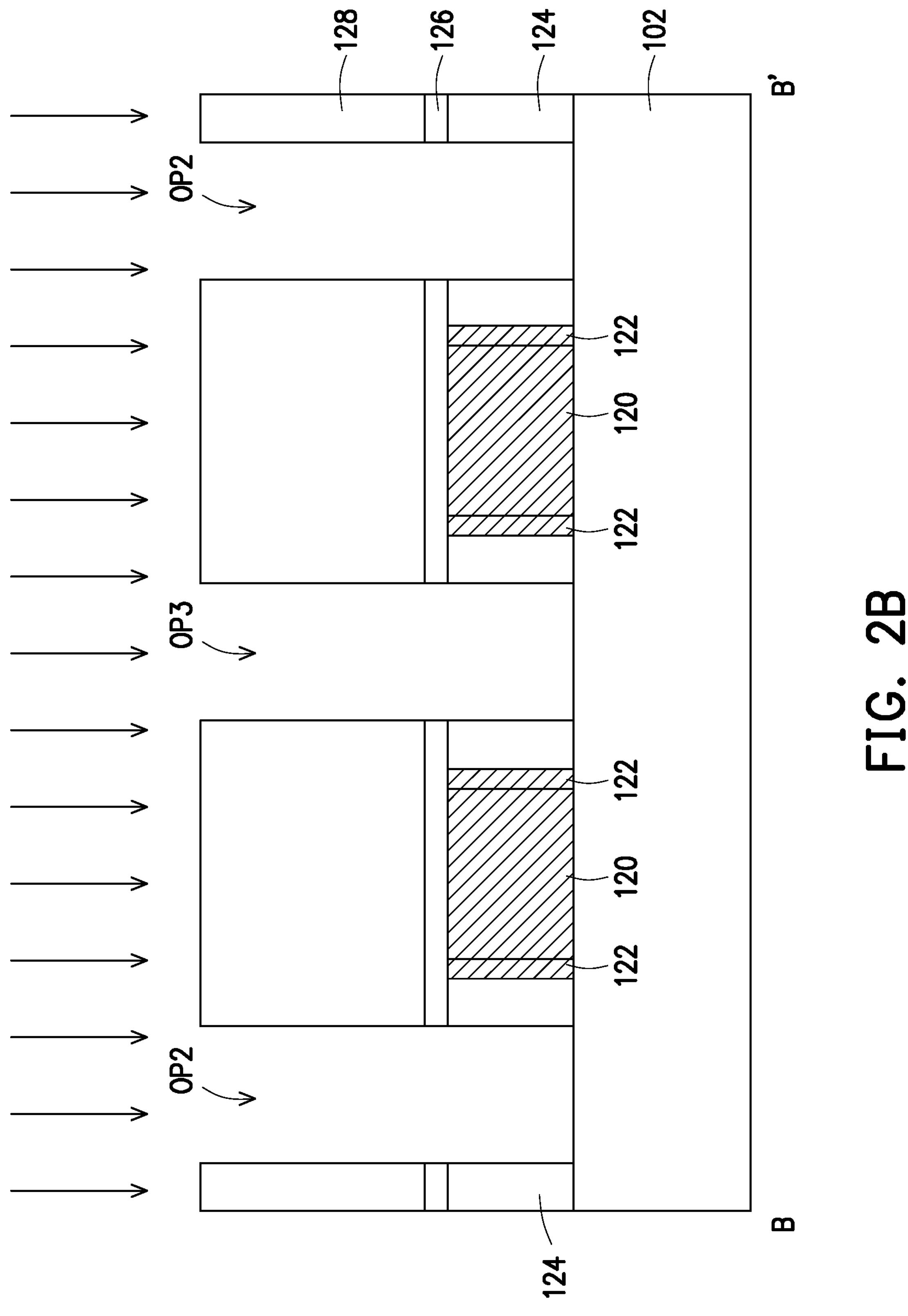

Referring to FIG. 2A and FIG. 2B, an initial structure of the semiconductor device 100 is provided. The initial structure includes a substrate 102. The substrate 102 may comprise an elementary (single element) semiconductor, such as silicon, germanium, and/or other suitable materials; a compound semiconductor, such as silicon carbide, gallium arsenic, gallium phosphide, indium phosphide, indium arsenide, indium antimonide, and/or other suitable materials; an alloy semiconductor such as SiGe, GaAsP, AlInAs, AlGaAs, GaInAs, GaInP, GaInAsP, and/or other suitable materials. The substrate 102 may be a single-layer material having a uniform composition. Alternatively, the substrate 102 may include multiple material layers having similar or different compositions suitable for semiconductor device manufacturing. In some embodiments, the substrate 102 may be a silicon-on-insulator (SOI) substrate having a semiconductor silicon layer formed on a silicon oxide layer. In another embodiment, the substrate 102 may include a conductive layer, a semiconductor layer, a dielectric layer, other layers, or combinations thereof. As indicated above, various doped regions may be formed in or on the substrate 102. The doped regions may be doped with n-type dopants, such as phosphorus or arsenic, and/or p-type dopants, such as boron or indium, depending on design requirements. The doped regions may be formed directly on the substrate 102, in a p-well structure, in an n-well structure, in a dual-well structure, or using a raised structure. Doped regions may be formed by implantation of dopant atoms, in-situ doped epitaxial growth, and/or other suitable techniques.

As illustrated in FIG. 2A and FIG. 2B, fin structures 104 (or active structures) are disposed on the substrate 102. The fin structures 104 may be fabricated using suitable processes including photolithography and etching processes. The photolithography process may include forming a photoresist layer overlying the substrate 102, exposing the photoresist to a pattern, performing post-exposure bake processes, and developing the photoresist to form a masking structure (not shown) including the resist. The masking structure is then used for etching recesses into the substrate 102, leaving the fin structures 104 on the substrate 102. The etching process may include dry etching, wet etching, reactive ion etching (RIE), and/or other suitable processes. In some embodiments, the fin structure 104 may be formed by double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process.

In some embodiments, isolation structures 106 are formed over the substrate to surround the fin structures 104. In some embodiments, the isolation structures 106 electrically separate various components of the semiconductor device 100. The isolation structures 106 may include silicon oxide, silicon nitride, silicon oxynitride, fluoride-doped silicate glass (FSG), a low-k dielectric material, and/or other suitable materials. In some embodiments, the isolation structures 106 may include shallow trench isolation (STI) features. In one embodiment, the isolation structures 106 are formed by etching trenches in the substrate 102 during the formation of the fin structures 104. The trenches may then be filled with an isolating material described above, followed by a chemical mechanical planarization (CMP) process. Other isolation structure such as field oxide, local oxidation of silicon (LOCOS), and/or other suitable structures may also be implemented as the isolation structures 106. Alternatively, the isolation structures 106 may include a multi-layer structure, for example, having one or more thermal oxide liner layers.

In some embodiments, gate structures 120 (corresponding to gate structures G1~G16 shown in FIG. 1) are disposed on the substrate 102 and over the fin structures 104. The gate structures 120 may be high-k metal gate (HKMG) stacks that contain a high-k gate dielectric and a metal gate electrode, where the HKMG structures are formed by replacing dummy gate structures. In some embodiments, spacers layers 122 may be located on the substrate 102 aside the gate structures 120. For example, the spacers layers 122 may include silicon nitride (SiN), a low-k material, or the like.

In some embodiment, the drain region 110A is disposed over the fin structures 104. Furthermore, in another region of the substrate 102 (not shown), source regions 110B may be disposed over other fin structures 104. The source regions 110B and drain regions 110A are formed over the recessed fin structures 104 by any suitable methods, such as epitaxial growth methods, or the like. In some embodiments, the source regions 110B and/or drain regions 110A are formed over (or "merges over") two recessed fin structures 104. However, the disclosure is not limited thereto, and the source regions 110B and/or drain regions 110A may be formed over one of the recessed fin structures 104.

In some embodiments, a dielectric layer 124 is formed on the substrate 102 to surround the gate structures 120 and the spacers layers 122. An etch-stop layer 126 is formed on the dielectric layer 124, and an interlayer dielectric 128 is formed on the etch-stop layer 126. The etch-stop layer 126 may be a silicon nitride (SiN) layer, or other suitable materials for protecting the underlying layers from etching processes. In some embodiments, the dielectric layer 124 and the interlayer dielectric 128 shown in FIG. 2B may correspond to the dielectric layer 108 shown in FIG. 2A. For example, the dielectric layer 108 may surround a top portion of the fin structures 104, and surround the source regions 110B and the drain regions 110A. In certain embodiments, the dielectric layer 124 and the interlayer dielectric 128 (or dielectric layer 108) may include any suitable materials, such as silicon oxides, SiCN, SiOCN, SiON, metal oxides, or combinations thereof.

As further illustrated in FIG. 2A and FIG. 2B, the dielectric layer 124 and the interlayer dielectric 128 (or dielectric layer 108) are patterned or etched to form openings OP1, openings OP2 and openings OP3. In some embodiments, a position of the openings OP1 corresponds to a position of the drain contacts DC1~DC7 formed in a subsequent step, and the openings OP1 may reveal the drain regions 110A located underneath. In some embodiments, a position of the openings OP2 corresponds to a position of the source contacts SC1~SC11 formed in a subsequent step, and the openings OP2 may reveal the source regions 110B (not shown) located underneath. Furthermore, a position of the openings OP3 corresponds to a position of the interconnect structures IC1~IC6 formed in a subsequent step.

Figure 3A:
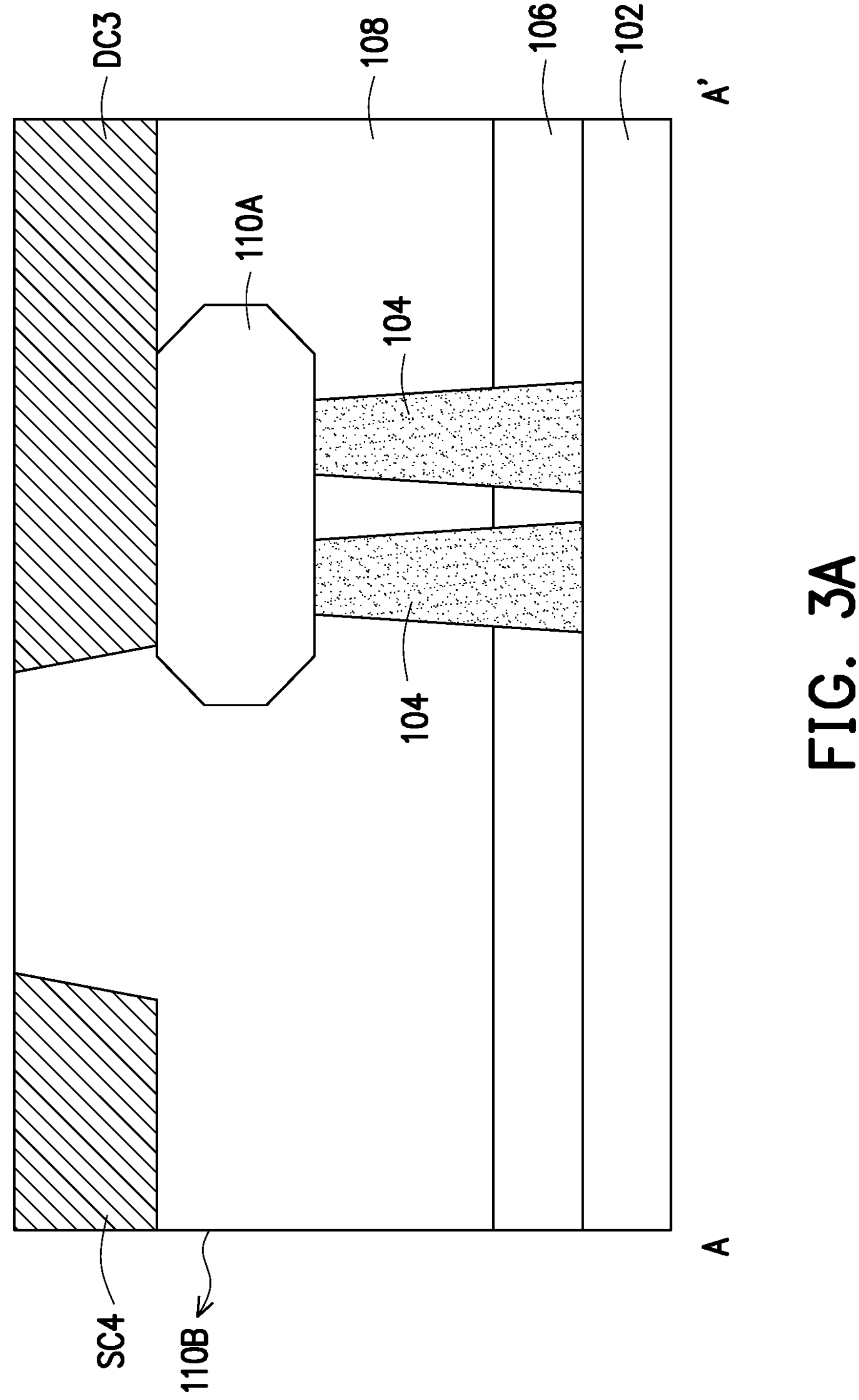
Figure 3B:
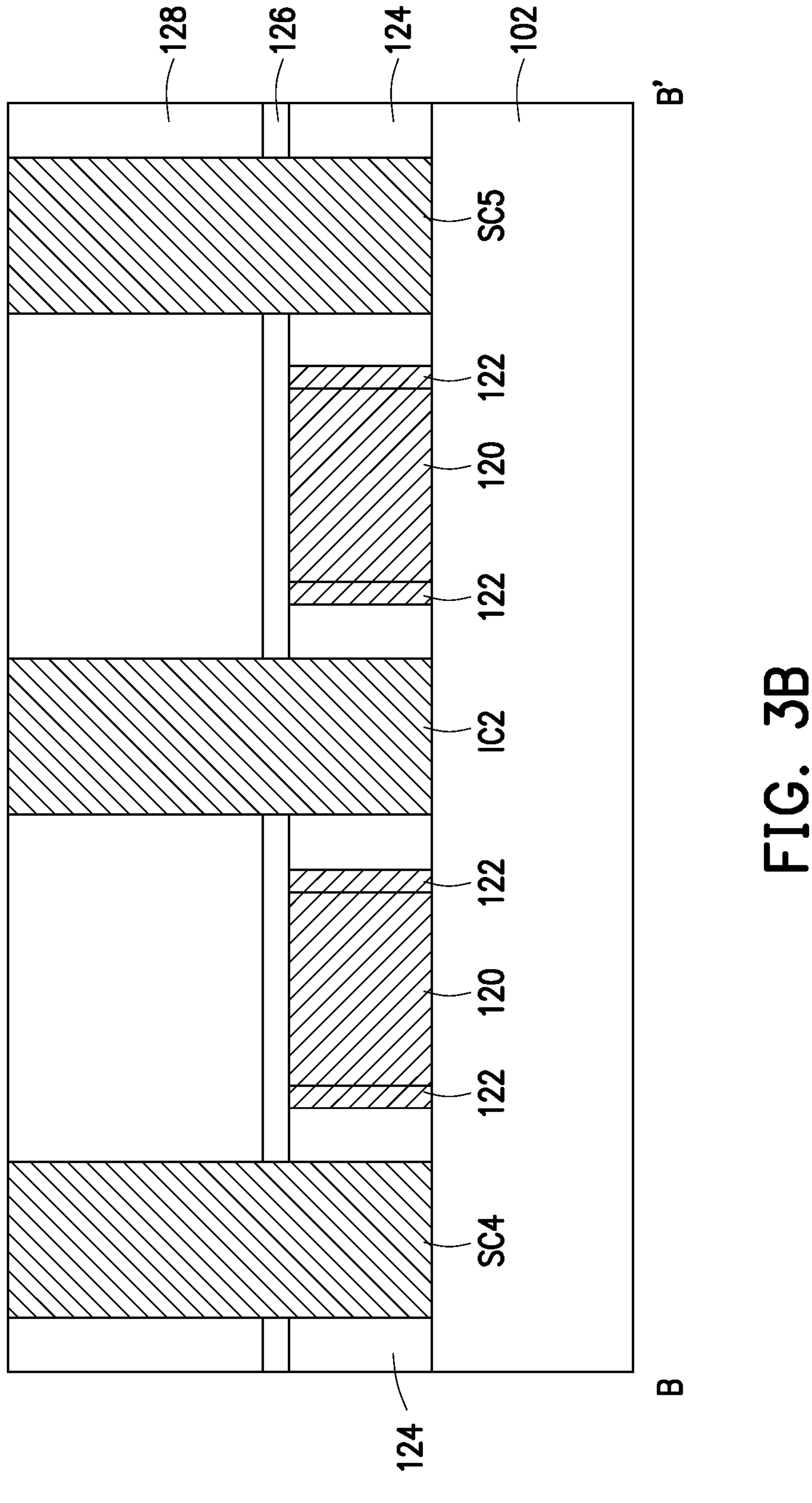

Referring to FIG. 3A to FIG. 3B, in a subsequent step, drain contacts DC1~DC7 (DC3 as shown in FIG. 3A) are formed in the openings OP1, source contacts SC1~SC11 (SC4, SC5 shown in FIG. 3A and FIG. 3B) are formed in the openings OP2 and interconnect structures IC1~IC6 (IC2 shown in FIG. 3B) are formed in the openings OP3. For example, the drain contacts DC1~DC7, source contacts SC1~SC11 and the interconnect structures IC1~IC6 are formed by depositing a metallic material in the openings in one single deposition process. In some other embodiments, the drain contacts DC1~DC7, source contacts SC1~SC11 and the interconnect structures IC1~IC6 are formed in sequential deposition processes. A planarization process, such as a chemical mechanical planarization (CMP) process may be performed to remove excess metallic material so that the top surfaces of the drain contacts DC1~DC7, the source contacts SC1~SC11 and the interconnect structures IC1~IC6 are substantially coplanar and aligned with one another. Furthermore, after the planarization process, the top surface of the interlayer dielectric 128 (or dielectric layer 108) are aligned with the top surfaces of the drain contacts DC1~DC7, the source contacts SC1~SC11 and the interconnect structures IC1~IC6.

Figure 4A:
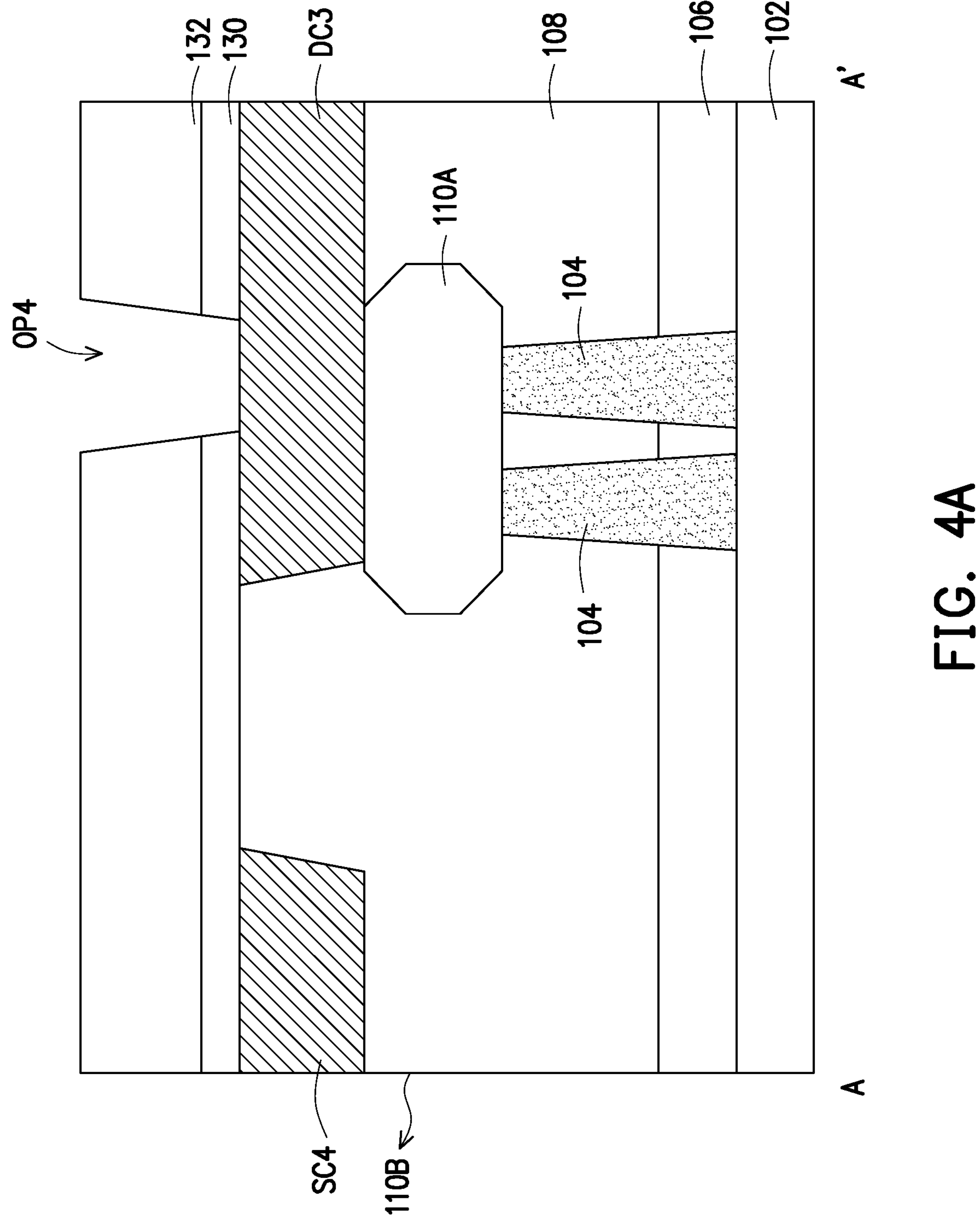
Figure 4B:

Referring to FIG. 4A and FIG. 4B, in a subsequent step, an etch-stop layer 130 is formed over the interlayer dielectric 128 (or dielectric layer 108) to cover the drain contacts DC1~DC7, the source contacts SC1~SC11 and the interconnect structures IC1~IC6. The etch-stop layer 130 may be a silicon nitride (SiN) layer, or other suitable materials for protecting the underlying layers from etching processes. In some embodiments, an interlayer dielectric 132 is formed over the top surface of the etch-stop layer 130. For example, the interlayer dielectric 132 may include any suitable materials, such as silicon oxides, SiCN, SiOCN, SiON, metal oxides, or combinations thereof.

Subsequently, the interlayer dielectric 132 is patterned and portions of the etch-stop layer 130 are removed to form the openings OP4 and openings OP5. The openings OP4 and openings OP5 may be formed by any suitable methods. In some embodiments, a patterned photoresist layer may be formed over the interlayer dielectric 132, whereby the patterned photoresist layer reveals portions of the interlayer dielectric 132. The patterned photoresist layer may be formed by lithography process that includes photoresist coating, exposure to ultraviolet (UV) radiation, and developing process. A hard mask, such as silicon nitride, or other suitable material, may be further used. In some embodiments, the openings of the patterned photoresist layer is first transferred to the hard mask by etching. Thereafter, an etching process, such as dry etching, wet etching or a combination thereof, is conducted to remove the exposed portions of the interlayer dielectric 132 to form the openings OP4 and openings OP5. In some embodiments, the openings OP4 reveal the top surfaces of the drain contacts DC1~DC7, while the openings OP5 reveal the top surfaces of the source contacts SC5~SC6. In certain embodiments, the width or length of the openings OP5 along the first direction D1 (as shown in FIG. 1) is greater than the width or length of the openings OP4 along the first direction D1.

Figure 5A:
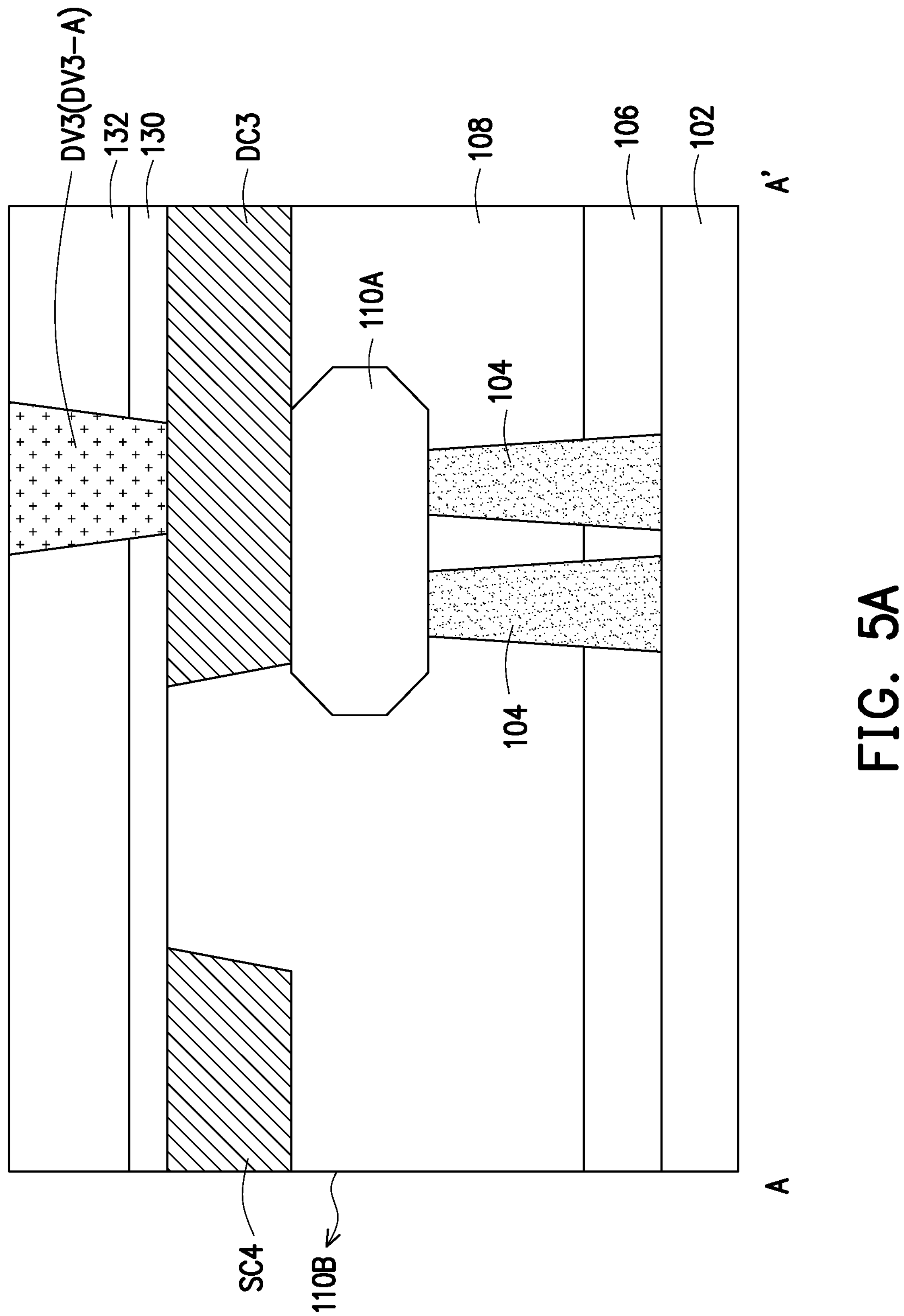
Figure 5B:
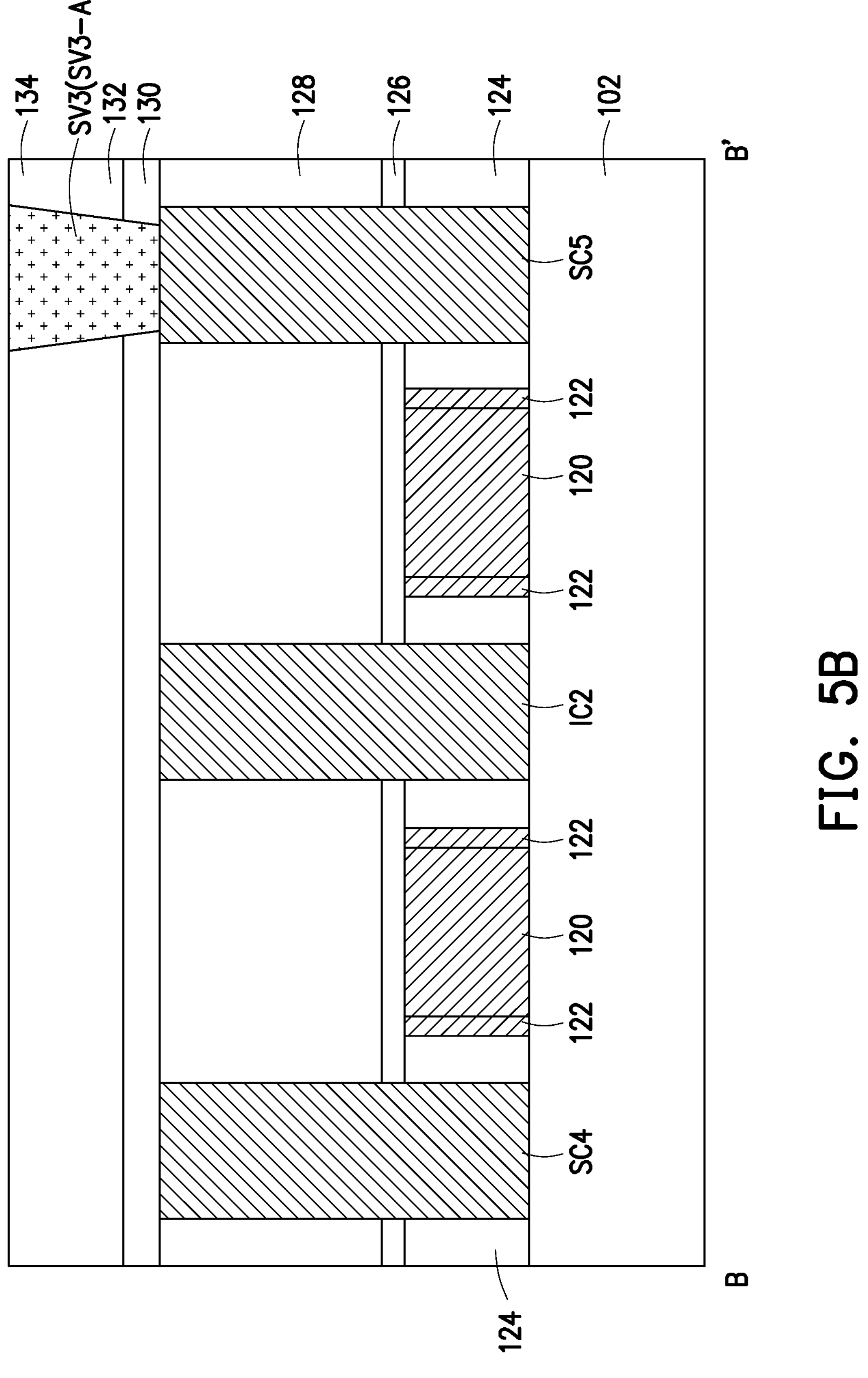

Referring to FIG. 5A and FIG. 5B, after forming the openings OP4 and openings OP5, the drain vias DV1~DV7 are formed in the openings OP4 and the source vias SV3~SV4 are formed in the openings OP5. A bottom-up process is performed for depositing the drain vias DV1~DV7 in the openings OP4, and for depositing the source vias SV3~SV4 in the openings OP5. In some embodiments, a chemical vapor deposition (CVD) method, an atomic layer deposition (ALD) method or the like may be used for depositing the drain vias DV1~DV7 and the source vias SV3~SV4. For example, a material of the drain vias DV1~DV7 and the source vias SV3~SV4 may be cobalt (Co), ruthenium (Ru), copper (Cu), tantalum (Ta), titanium (Ti), iridium (Ir), tungsten (W), aluminum (Al), tantalum nitride (TaN), or other suitable metals. In certain embodiments, a material of the drain vias DV1~DV7 and the source vias SV3~SV4 are tungsten (W). In some embodiments, the drain vias DV1~DV7 and the source vias SV3~SV4 respectively includes a barrier-less body portion. For example, as illustrated in FIG. 5A, the drain via DV3 includes a barrier-less body portion DV3-A. Furthermore, as illustrated in FIG. 5B, the source via SV3 includes a barrier-less body portion SV3-A. In other words, the drain vias DV1~DV7 and the source vias SV3~SV4 are vias made without a barrier layer. In the exemplary embodiment, the width or length of the source vias SV3~SV4 along the first direction D1 (as shown in FIG. 1) is greater than the width or length of the drain vias DV-DV7 along the first direction D1. In other words, a source contact surface area (landing surface) of the source vias SV3~SV4 to the respective source contacts SC5~SC6 is greater than a drain contact surface area of the drain vias DV1~DV7 to the respective drain contacts DC1~DC7.

Figure 6A:
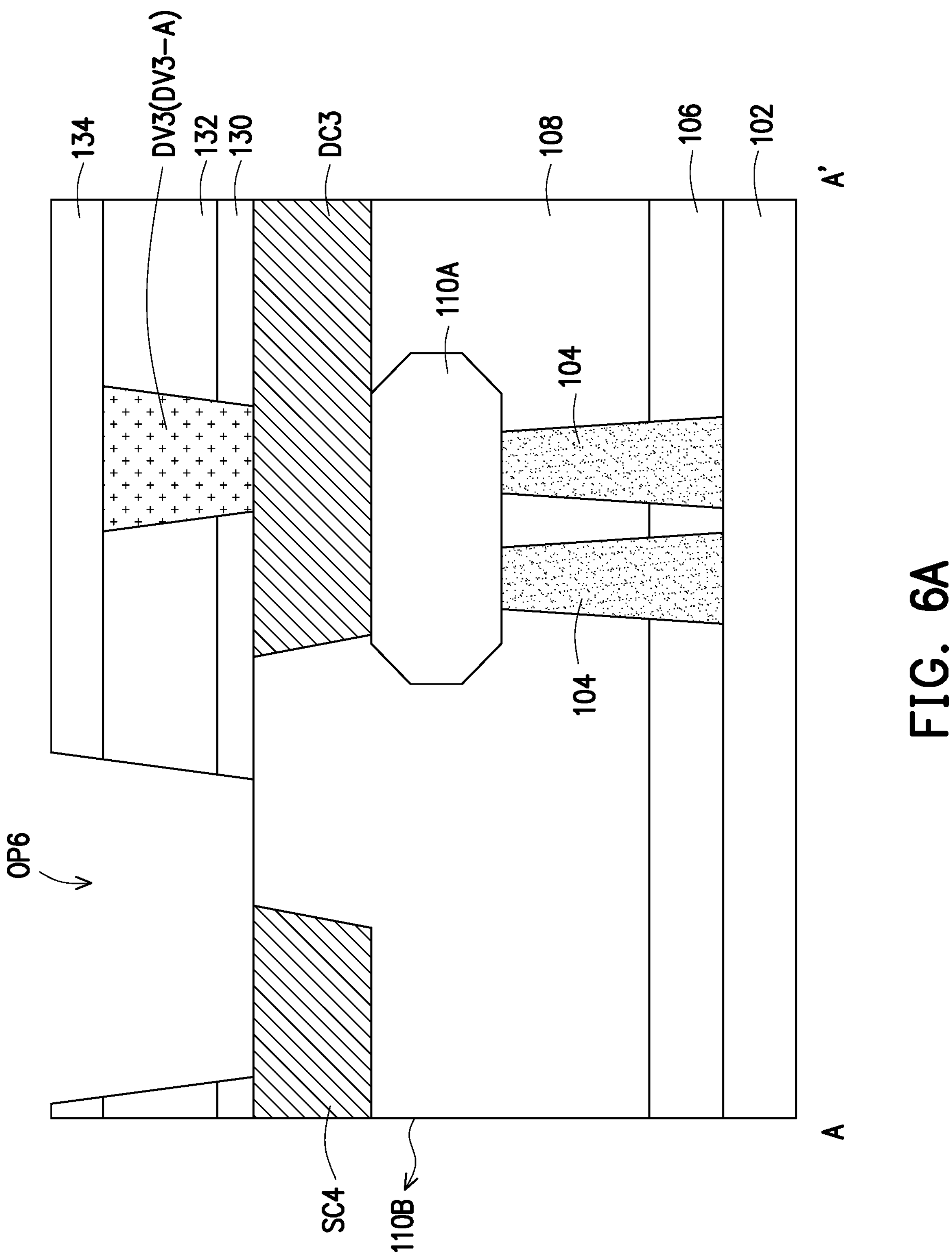
Figure 6B:
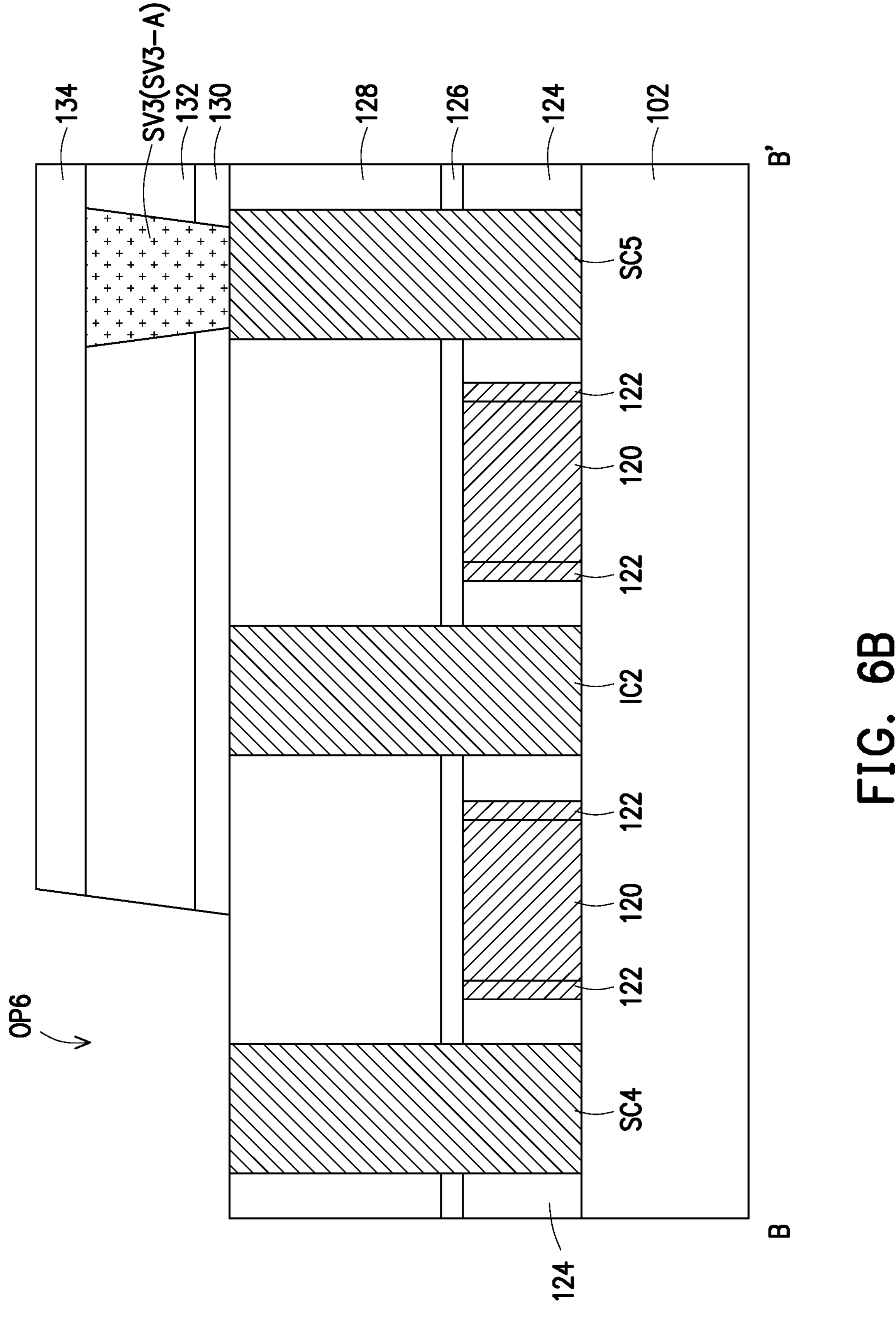

Referring to FIG. 6A to FIG. 6B, in a subsequent step, an interlayer dielectric 134 is formed over the interlayer dielectric 132. For example, the interlayer dielectric 134 may include any suitable materials, such as silicon oxides, SiCN, SiOCN, SiON, metal oxides, or combinations thereof. In some embodiments, the interlayer dielectrics 132, 134 may be patterned and portions of the etch-stop layer 130 is removed to form the openings OP6. The openings OP6 may be formed by any suitable methods similar to that of forming the openings OP4 and openings OP5, thus its details will not be repeated herein. In some embodiments, the openings OP6 reveals the top surfaces of the source contacts SC1~SC4, SC7~SC11 located underneath. In certain embodiments, the width or length of the openings OP6 along the first direction D1 and the second direction D2 (as shown in FIG. 1) are greater than the width or length of the openings OP4 along the first direction D1 and the second direction D2.

Figure 7A:
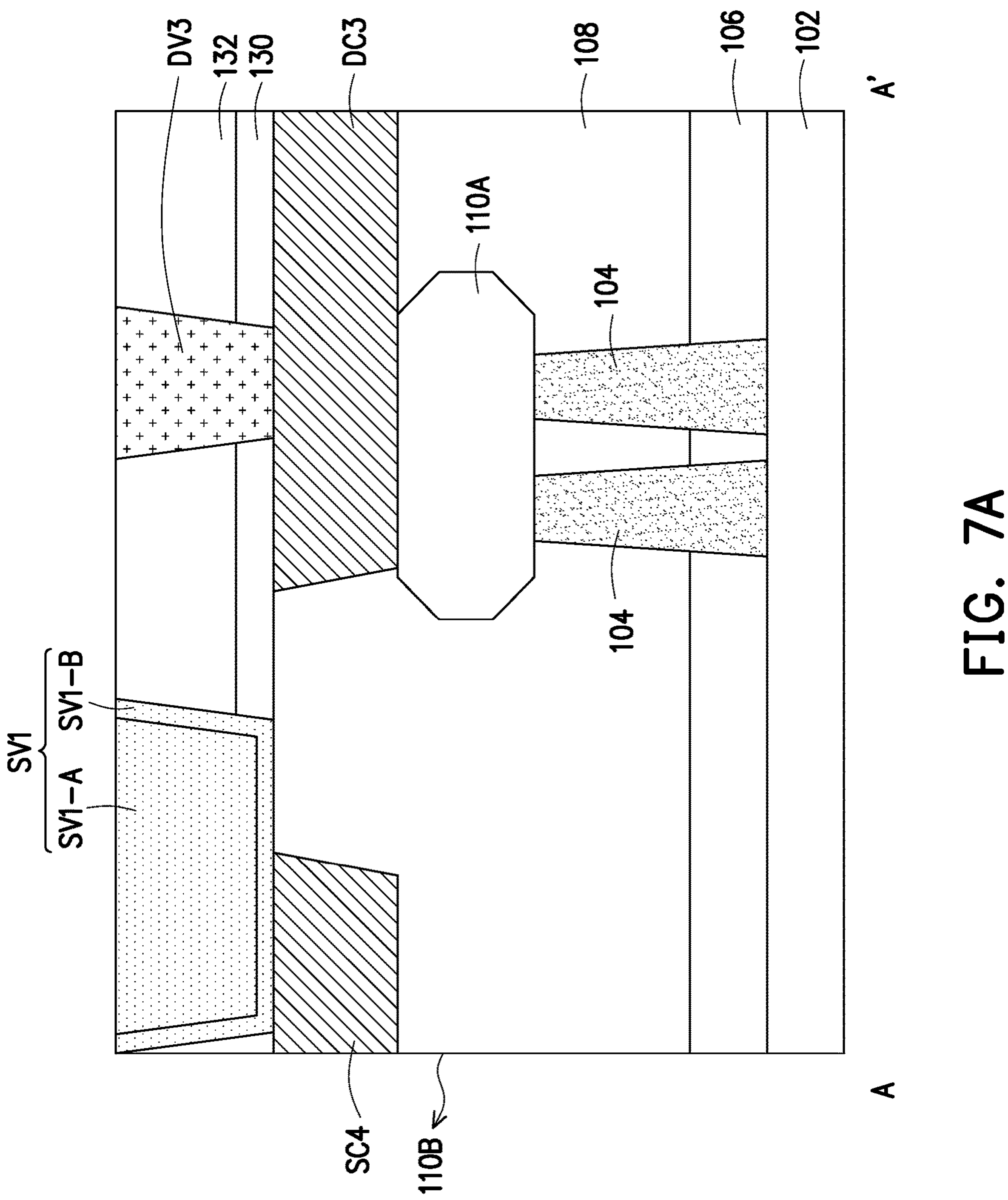
Figure 7B:
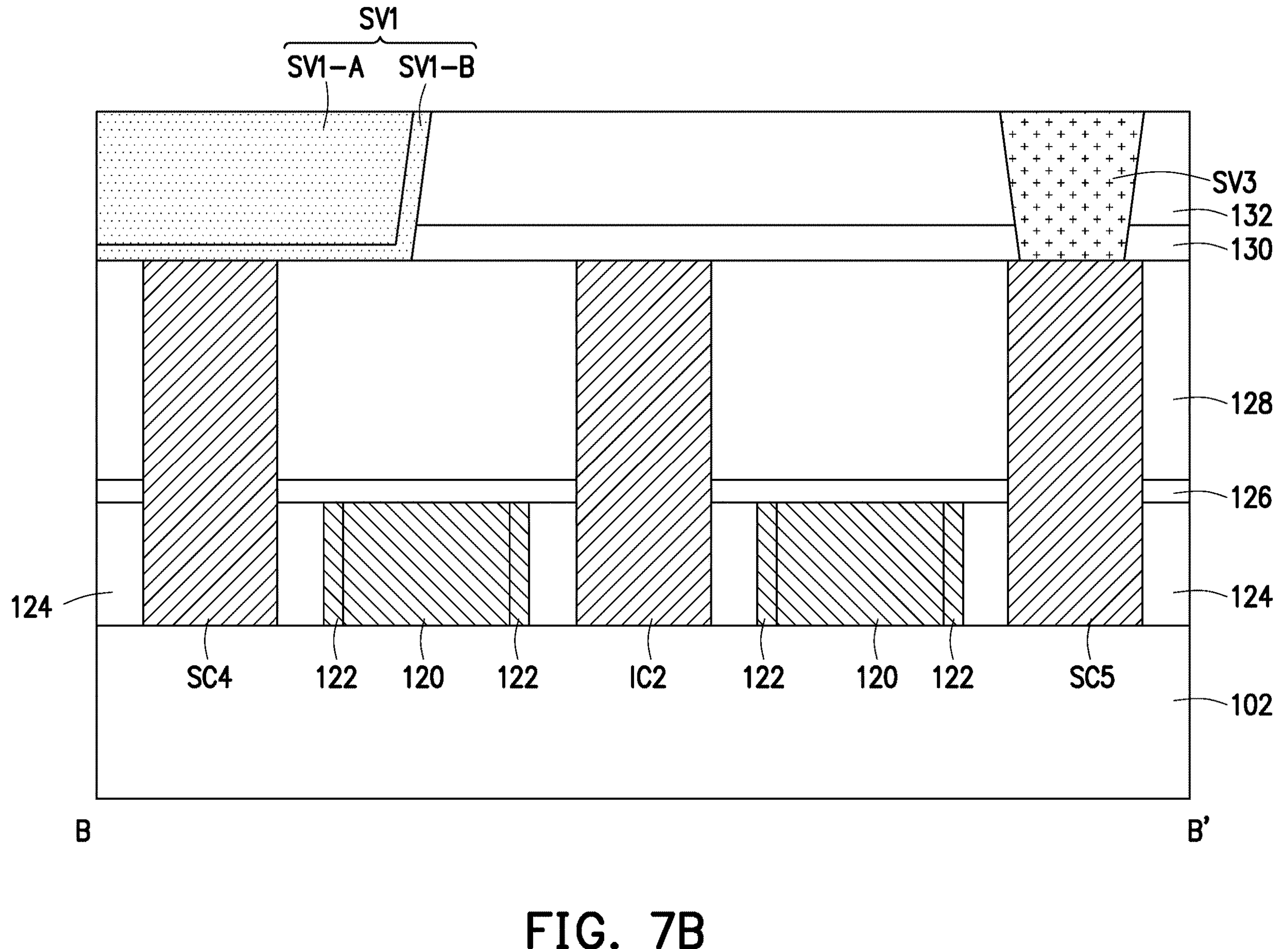

Referring to FIG. 7A to FIG. 7B, after forming the openings OP6, the source vias SV1~~SV2, SV5~SV6 are formed in the openings OP6. The source vias SV1~SV2, SV5~SV6 are respectively formed with a body portion and a barrier layer surrounding the body portion. For example, as illustrated in FIG. 7A to FIG. 7B, the source via SV1 with a body portion SV1-A and a barrier layer SV1-B surrounding the body portion SV1-A. For example, the barrier layer SV1-B includes a titanium (Ti)/titanium nitride (TiN) layer, while the body portion SV1-A may be made of the same materials as the drain vias DV1~DV7 and the source vias SV3~SV4. In the exemplary embodiment, the width or length of the source vias SV1~SV2, SV5~SV6 along the first direction D1 and the second direction D2 (as shown in FIG. 1) are greater than the width or length of the drain vias DV1~DV7 along the first direction D1 and the second direction D2. In other words, a source contact surface area (landing surface) of the source vias SV1~SV2, SV5~SV6 to the respective source contacts SC1~SC4, SC7~SC11 is greater than a drain contact surface area of the drain vias DV1~DV7 to the respective drain contacts DC1~DC7. In the exemplary embodiment, the length or width of the source vias SV1~SV6 along the first direction D1 may be in a range of 5 nm to 300 nm, while the length or width of the source vias SV1~SV6 along the first direction D2 may be in a range of 10 nm to 200 μm. In certain embodiments, the length or width of the drain vias DV1~DV7 along the first direction D1 and the second direction D2 may be in a range of 3 nm to 50 nm. After forming the source vias SV1~SV6 and the drain vias DV1~DV7, metal lines ML1 are disposed on and connected to the drain vias DV1~DV7, while metal lines ML2 are disposed on and connected to the source vias SV1~SV6 in the way as shown in FIG. 1. Up to here, a method of fabricating the semiconductor device 100 is accomplished.

In the above-mentioned embodiments, the semiconductor device includes source vias and drain vias respectively connected to the source/drain contacts, whereby a size of the source vias is greater than a size the drain vias. Furthermore, the source vias may be used to connect the source contacts in different columns of the power rail structure. As such, since the source side vias (source side power rail) are made with a larger contact surface area to the source contact, as compared to the contact surface area of the drain side vias (drain side power rail) to the drain contact, the contact resistance and sheet resistance are further reduced, and the device performance is further improved.

In accordance with some embodiments of the present disclosure, a semiconductor device includes a source region and a drain region, a first source contact, a first drain contact, a first drain via and a first source via. The source region and the drain region are located over a substrate. The first source contact is disposed on the source region, and the first drain contact is disposed on the drain region. The first drain via is connected to the first drain contact, wherein the first drain via includes a barrier-less body portion. The first source via is connected to the first source contact, wherein the first source via includes a body portion and a barrier layer surrounding the body portion, and a size of the first source via is greater than a size of the first drain via.

In accordance with some other embodiments of the present disclosure, a semiconductor device includes a gate structure, a first source contact, a first drain contact, a second source contact, a second drain contact, a first drain via, a second drain via and a first shared source via. The gate structure is located on a substrate and extending in a first direction. The first source contact and the first drain contact are located on a first side of the gate structure and extending in the first direction. The second source contact and the second drain contact are located on a second side of the gate structure and extending in the first direction. The first drain via is connected to the first drain contact. The second drain via is connected to the second drain contact. The first shared source via is connected to and extending from the first source contact to the second source contact.

In accordance with yet another embodiment of the present disclosure, a method of fabricating a semiconductor device is described. The method includes the following steps. A source region and a drain region are formed over a substrate. A first source contact is formed to be disposed on the source region and a first drain contact is formed to be disposed on the drain region. A first drain via is formed to be connected to the first drain contact, wherein the first drain via includes a barrier-less body portion. A first source via is formed to be connected to the first source contact, wherein the first source via includes a body portion and a barrier layer surrounding the body portion, and a size of the first source via is greater than a size of the first drain via.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:

a source region and a drain region over a substrate;

a first source contact disposed on the source region and extending along a first direction;

a first drain contact disposed on the drain region and extending along the first direction;

a first gate structure and a second gate structure located on two sides of the first source contact and respectively extending along the first direction;

a first drain via connected to the first drain contact, wherein the first drain via includes a barrier-less body portion;

a first source via connected to the first source contact, wherein the first source via includes a body portion and a barrier layer surrounding the body portion, and a size of the first source via is greater than a size of the first drain via, and wherein the first source via is extending along a second direction perpendicular to the first direction and is overlapped with the first gate structure and the second gate structure; and a second source contact located aside the first source contact, wherein the first source via extends from the first source contact towards the second source contact, and is electrically connected to the second source contact.

2. The semiconductor device according to claim 1, wherein a ratio of a top surface area of the first drain via to a top surface area of the first source via is in a range of 1:1.1 to 1:50.

3. The semiconductor device according to claim 1, wherein a width of the first source via in the first direction is greater than a width of the first drain via in the first direction.

4. The semiconductor device according to claim 1, wherein sidewalls of the first source via extends beyond sidewalls of the first source contact.

5. The semiconductor device according to claim 1, wherein from a top view of the semiconductor device, the first source via has a first quadrilateral-shaped portion overlapped with the first source contact, and a second quadrilateral-shaped portion joined with the first quadrilateral-shaped portion and overlapped with the second source contact, and sidewalls of the first quadrilateral-shaped portion are misaligned with sidewalls of the second quadrilateral-shaped portion.

6. The semiconductor device according to claim 1, further comprising:

a first metal line disposed on and connected to the first drain via; and a second metal line disposed on and connected to first source via, wherein a width of the second metal line is greater than a width of the first metal line.

7. The semiconductor device according to claim 1, further comprising a plurality of fin structures disposed on the substrate and extending along the second direction, wherein the first source contact, the first gate structure and the first drain via are disposed on the plurality of fin structures, and vertically overlapped with the plurality of fin structures.

8. A semiconductor device, comprising:

a gate structure located on a substrate and extending in a first direction;

a first source contact and a first drain contact located on a first side of the gate structure and extending in the first direction, wherein the first source contact has a first inner sidewall facing the first side of the gate structure and a first outer sidewall facing away from the gate structure;

a second source contact and a second drain contact located on a second side of the gate structure and extending in the first direction, wherein the second source contact has a second inner sidewall facing the second side of the gate structure and a second outer sidewall facing away from the gate structure;

a first drain via connected to the first drain contact;

a second drain via connected to the second drain contact; and a first shared source via connected to and extending from the first source contact to the second source contact, wherein the first shared source via extends from a position beyond the first outer sidewall of the first source contact, and extends continuously across the first inner sidewall, the gate structure, the second inner sidewall, and extends beyond the second outer sidewall of the second source contact, wherein the first shared source via includes a body portion and a barrier layer surrounding the body portion, and the first drain via and the second drain via respectively includes a barrier-less body portion.

9. The semiconductor device according to claim 8, wherein a ratio of a top surface area of the first drain via to a top surface area of the first shared source via is in a range of 1:1.1 to 1:50.

10. The semiconductor device according to claim 8, wherein the first shared source via is extending in a second direction perpendicular to the first direction from the first source contact to the second source contact.

11. The semiconductor device according to claim 8, wherein from a top view of the semiconductor device, the first shared source via has a first quadrilateral-shaped portion overlapped with the first source contact, and a second quadrilateral-shaped portion joined with the first quadrilateral-shaped portion and overlapped with the second source contact, and sidewalls of the first quadrilateral-shaped portion are misaligned with sidewalls of the second quadrilateral-shaped portion.

12. The semiconductor device according to claim 8, wherein a source contact surface area of the first shared source via to the first source contact and the second source contact, is greater than a sum of the drain contact surface areas of the first drain via to first drain contact and the second drain via to the second drain contact.

13. The semiconductor device according to claim 8, further comprising:

a second gate located aside the second source contact and the second drain contact and extending in the first direction; and a third source contact located aside the second gate, wherein the second gate is located in between the third source contact and the second source contact, and the first shared source via is connected to and further extends towards the third source contact.

14. The semiconductor device according to claim 8, further comprising:

a first metal line disposed on and connected to the first drain via; and a second metal line disposed on and connected to first shared source via, wherein a width of the second metal line is greater than a width of the first metal line.

15. The semiconductor device according to claim 8, further comprising an interconnection structure disposed on the substrate and extending in the first direction, wherein sidewalls of the interconnection structure are aligned with sidewalls of the first source contact along the first direction.

16. A method of fabricating a semiconductor device, comprising:

forming a source region and a drain region over a substrate;

forming a first source contact disposed on the source region and a first drain contact disposed on the drain region, wherein the first source contact and the first drain contact are extending along a first direction;

forming a first gate structure and a second gate structure on two sides of the first source contact and respectively extending along the first direction;

forming a first drain via connected to the first drain contact, wherein the first drain via includes a barrierless body portion;

forming a first source via connected to the first source contact, wherein the first source via includes a body portion and a barrier layer surrounding the body portion, and a size of the first source via is greater than a size of the first drain via, and wherein the first source via is extending along a second direction perpendicular to the first direction and is overlapped with the first gate structure and the second gate structure; and forming a second source contact aside the first source contact, wherein the first source via extends from the first source contact towards the second source contact, and is electrically connected to the second source contact.

17. The method according to claim 16, wherein the first drain via and the first source via are formed in different steps.

18. The method according to claim 16, further comprising:

forming an etch-stop layer over the first source contact and the first drain contact prior to forming the first drain via and the first source via;

forming a dielectric layer over the etch-stop layer;

forming a first opening in the dielectric layer and the etch-stop layer to reveal the first drain contact, and forming the first drain via in the first opening; and forming a second opening in the dielectric layer and the etch-stop layer to reveal the first source contact, and forming the first source via in the second opening.

19. The method according to claim 18, wherein after forming the second source contact, the method further comprising:

forming the second opening in the dielectric layer and the etch-stop layer to reveal the first source contact and the second source contact; and forming the first source via in the second opening so that it extends from the first source contact towards the second source contact.

20. The method according to claim 19, wherein forming the first source via comprises forming a first quadrilateral-shaped portion overlapped with the first source contact, and forming a second quadrilateral-shaped portion joined with the first quadrilateral-shaped portion and overlapped with the second source contact, and wherein sidewalls of the first quadrilateral-shaped portion are misaligned with sidewalls of the second quadrilateral-shaped portion.

* * * * *